(12) United States Patent
Sato et al.

(10) Patent No.: US 6,201,259 B1
(45) Date of Patent: Mar. 13, 2001

(54) TUNNELING MAGNETORESISTANCE ELEMENT, AND MAGNETIC SENSOR, MAGNETIC HEAD AND MAGNETIC MEMORY USING THE ELEMENT

(75) Inventors: Toshihiko Sato, Kawaguchi; Ryoichi Nakatani, Urawa, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/268,714

(22) Filed: Mar. 17, 1999

(30) Foreign Application Priority Data

Mar. 18, 1998 (JP) .................................. 10-068096

(51) Int. Cl.[7] .................................................. H01L 39/00
(52) U.S. Cl. .............................. 257/30; 257/421; 257/427
(58) Field of Search ........................... 257/30, 421, 427; 345/157, 158

(56) References Cited

U.S. PATENT DOCUMENTS 5,416,353 * 5/1995 Kamiguchi et al. ................. 257/421
5,801,984 * 9/1998 Parkin ................................. 365/158
5,877,511 * 3/1999 Tanamoto et al. ..................... 257/30

OTHER PUBLICATIONS

Physics Letters, vol. 54A, No. 3, (1975), pp 225–226.
J. Moodera et al, Symposium on Spin Tunneling and Injection Phenomena, J. Appl. Phys. 79(8), Apr. 15, 1996, pp. 4724–4729.

* cited by examiner

*Primary Examiner*—Sara Crane
(74) *Attorney, Agent, or Firm*—Mattingly, Stanger & Malur, P.C.

(57) ABSTRACT

A magnetic material is used for the gate of a MOSFET, and tunnel junctions are formed between a magnetic electrode and the gate electrode, and between a nonmagnetic electrode and the gate electrode. The magnetic gate electrode is biased through the two tunnel junctions, and the drain current of the MOSFET changes with a change in an external magnetic field, according to the tunneling magnetoresistance effect. Thus, the MOSFET can be used as a magnetic sensor, as the reading element in a read/write head, or in a magnetic memory cell of a magnetic random access memory.

23 Claims, 11 Drawing Sheets

TUNNELING MAGNETORESISTANCE ELEMENT, AND MAGNETIC SENSOR, MAGNETIC HEAD AND MAGNETIC MEMORY USING THE ELEMENT

BACKGROUND OF THE INVENTION

1. Field of the Invention

The present invention relates generally to tunneling magnetoresistance elements, and more particularly to a tunneling magnetoresistance element having high sensitivity, and to a magnetic sensor, magnetic head, and magnetic memory using the tunneling magnetoresistance element.

2. Description of the Related Art

A magnetic sensor having a tunneling magnetoresistance (TMR) effect element is disclosed in *Physics Letters,* Vol. 54A, No. 3, 225 (1975). A TMR element exhibits a better magnetoresistance effect than that exhibited by other magnetoresistance (MR) elements currently known. Thus, the TMR element is of interest for study in the development of reproducing magnetic heads.

Referring to FIG. 1, the TMR element has a structure into which a dielectric insulating layer 310 is sandwiched between a magnetic layer 110 and a magnetic layer 210. When the two magnetic layers 110, 210 have different coercive forces, the respective directions of magnetization of the individual magnetic layers change between a parallel and an antiparallel relation in dependence on the change in the external magnetic field 800. Additionally, when a bias voltage V is applied between these two magnetic layers 110, 210, a tunnel current flows through the insulating layer 310, and a tunnel resistance R for the device can be defined by R=V/I. The tunnel resistance R changes in dependence upon whether the directions of magnetization of the magnetic layers 110, 210 are parallel or antiparallel. A TMR element that exhibits the change in tunnel resistance R with changing external magnetic field 800 can be used as a magnetic sensor.

In conjunction with the MR element of the prior art, a circuit construction has been used in which an electric current bias is effected between the terminals of the element to sense the voltage change across the element caused by the change in the external magnetic field. However, when the conventional MR element is replaced by a TMR element, there is a large difference between the impedances of the terminals. For example, as described in *J. Appl. Phys.* Vol. 79, No. 8, 4724 (1996), a TMR element has a terminal impedance of several kiloohms, while an MR element has a terminal impedance of about tens of ohms. The main reason for the difference resides in the controllability of the method of forming a tunnel barrier layer.

As described in the above *J. Appl. Phys.* article, a tunnel barrier of about 1 to 2 nanometers, as necessary, is created by oxidizing a metal film of Al or the like having a similar thickness. A sufficient average thickness is required to form a tunnel barrier layer which has little leakage current due to pin holes. As a result, the tunnel resistance cannot be lowered below a certain value.

Moreover, variation in the tunnel resistance of the elements which are thus fabricated is large, because the tunnel resistance depends exponentially on the thickness of the tunnel barrier layer, whereby a small variation in the dielectric layer thickness appears as a large variation in the tunnel resistance. This tunnel resistance variation is especially noted among plural elements formed over different substrates, in comparison with the variation of tunnel resistance of plural elements formed over a common substrate, because the reproducibility and controllability of the oxidation process is insufficient.

SUMMARY OF THE INVENTION

The present invention seeks to solve these and other problems of the prior art by improving the impedance matching between the TMR element and the external circuit, and by reducing the characteristic variation among mass-produced elements.

To solve these and other problems of the prior art, the invention employs certain features of the known MOSFET construction, including a substrate overlaid by a source region, a drain region, and a gate oxide film, which is overlaid by a magnetic gate electrode. A tunneling oxide film is formed over the entire upper face of the gate, and a magnetic layer and a nonmagnetic layer are formed on the tunneling oxide film. A tunnel junction is thus formed through a part of the tunneling oxide film in the region where the magnetic gate electrode and the magnetic layer overlap. A similar tunnel junction is also formed between the magnetic gate electrode and the nonmagnetic layer.

The features of the invention can be applied in a field-effect transistor, a magnetic sensor, a magnetic read/write head, or a magnetic memory cell, all as outlined in the detailed description that follows.

DETAILED DESCRIPTION OF THE PREFERRED EMBODIMENTS

Figure 1:
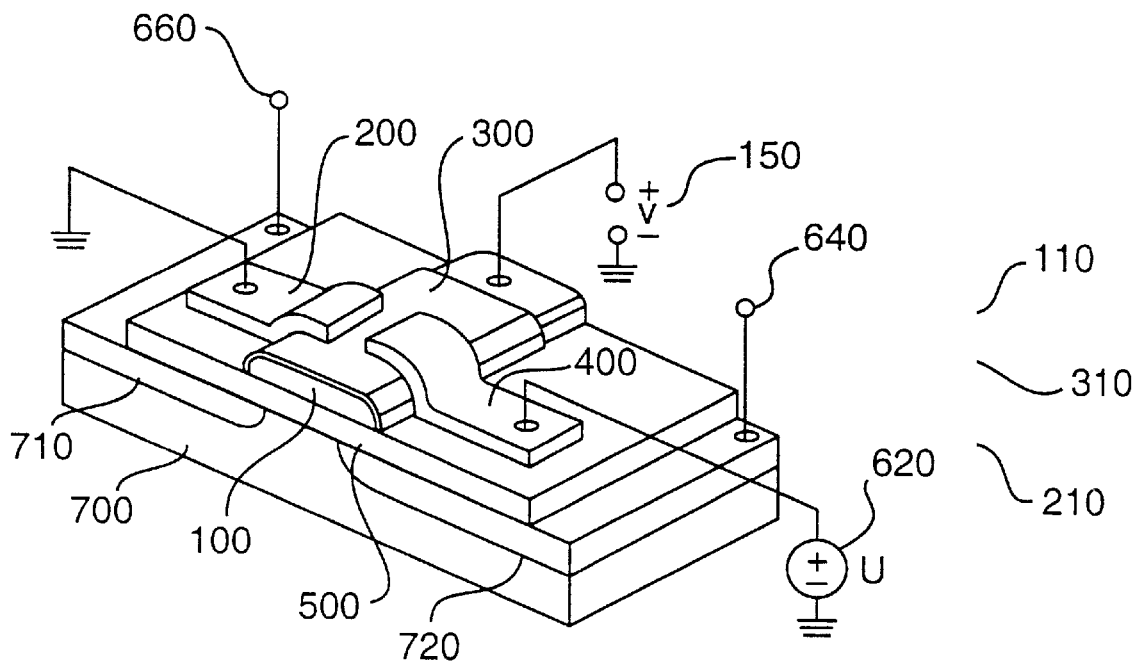
FIG. 1 is a diagram showing a relationship between a tunneling magnetoresistance element of the prior art and an external circuit.
Figure 2:
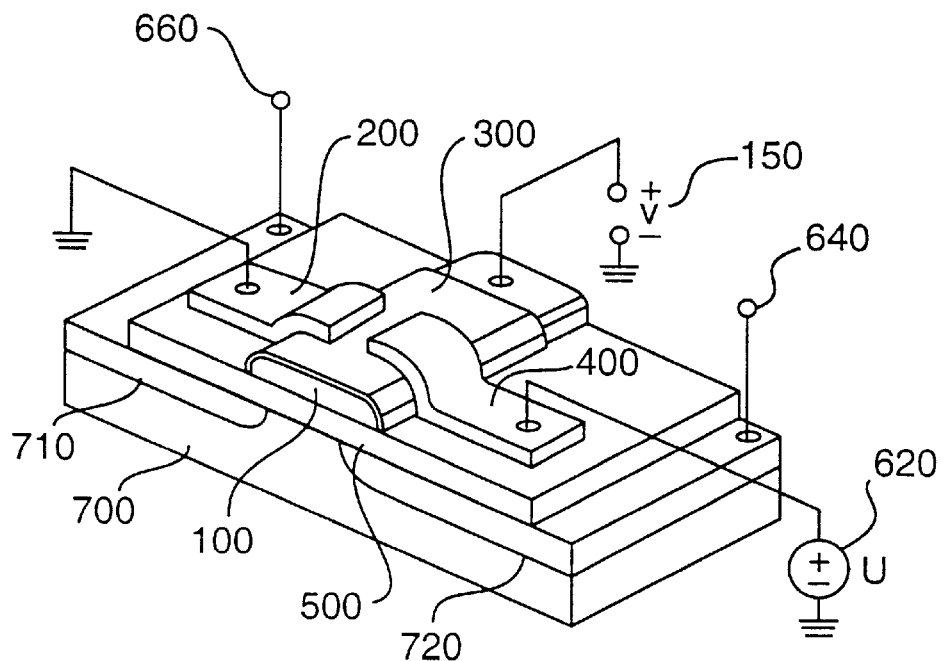
FIG. 2 is a conceptual diagram showing a tunneling magnetoresistance element according to the present invention.

The present invention uses a metal-oxide semiconductor field-effect transistor (MOSFET) as shown in FIG. 2. The element shown in FIG. 2 has certain features of the known MOSFET construction, including a P-type silicon substrate 700 overlaid by an N-doped source region 710, a drain region 720, and a gate oxide film 500, which is overlaid by a magnetic gate electrode 100. The device shown in FIG. 2 differs from the conventional MOSFET in that the gate is made of a magnetic material, a tunneling oxide film 300 is formed over the entire upper face of the gate, and a magnetic layer 200 and a nonmagnetic layer 400 are formed on the tunneling oxide film 300. In this state, a tunnel junction is formed through a part of the tunneling oxide film 300 in the region where the magnetic gate electrode 100 and the magnetic layer 200 overlap. A similar tunnel junction is also formed between the magnetic gate electrode 100 and the nonmagnetic layer 400.

The bias conditions for this element are determined by the potentials of the source region 710 and the drain region 720 with respect to the magnetic layer 200, the potential difference therebetween, and a bias voltage U 620 applied between the magnetic layer 200 and the nonmagnetic layer 400. Here, the voltage 150 generated between the magnetic gate electrode 100 and the magnetic layer 200 is designated by V.

Figure 3A:
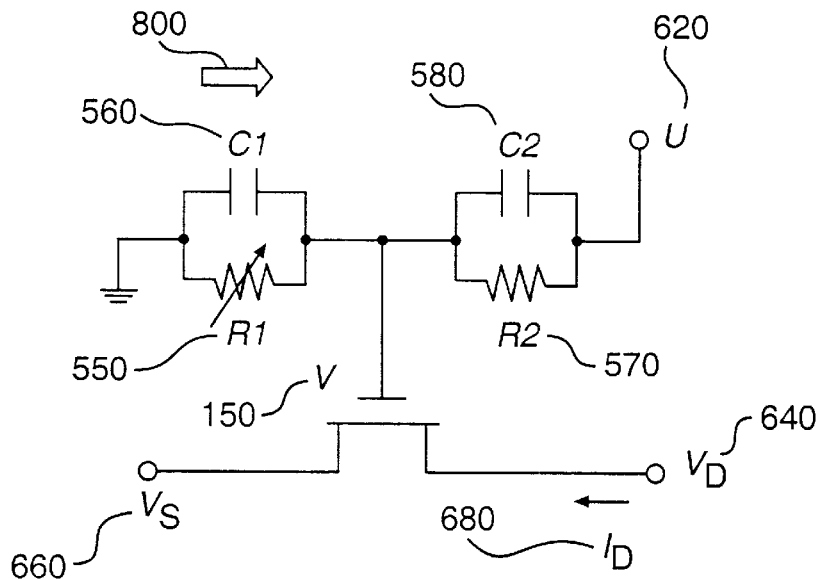
FIG. 3(*a*) shows an equivalent circuit of the tunneling magnetoresistance element of the invention, and FIG. 3(*b*) shows effects of the equivalent circuit.

FIG. 3(a) shows an equivalent circuit of the element shown in FIG. 2. In FIG. 3(a), a tunnel resistance 550 of the tunnel junction formed between the magnetic layer 200 and the magnetic gate electrode 100 is designated by R1, and a tunnel junction capacitance 560 thereof is designated by C1. The tunnel phenomenon between the magnetic layer 200 and the magnetic gate electrode 100 is the source of the tunneling magnetoresistance effect, similar to that occurring in a tunnel junction between magnetic materials having different forces. In FIG. 3(a), therefore, the tunnel resistance 550 is a variable resistance whose resistance changes with an external magnetic field 800.

A tunnel resistance 570 of the tunnel junction formed between the nonmagnetic layer 400 and the magnetic gate electrode 100 is designated by R2, and a tunnel junction capacitance 580 thereof is designated by C2. In this junction, there is no tunneling magnetoresistance effect.

Considering a current path extending to the magnetic layer 200 through the tunneling oxide film 300 and the magnetic gate electrode 100 from the nonmagnetic layer 400 to which the bias voltage U is applied, the voltage V 150 generated between the magnetic gate electrode 100 and the magnetic layer 200 is defined: $V=[1/(1+R2/R1)]*U$, which is produced by dividing the bias voltage U 620 by the two tunnel resistances R1 550 and R2 570. As the external magnetic field 800 changes, the tunnel resistance R1 550 is changed in accordance with the tunneling magnetoresistance effect to change the voltage V 150. However, since the magnetic gate electrode 100 is capacitively coupled through the gate oxide film 500 to the channel formed between the source and drain, the change in the voltage V 150 causes a change in a drain current 680. If the change in the drain current 680 is observed, therefore, a change in the external magnetic field 800 can be detected and observed accordingly.

Figure 3B:
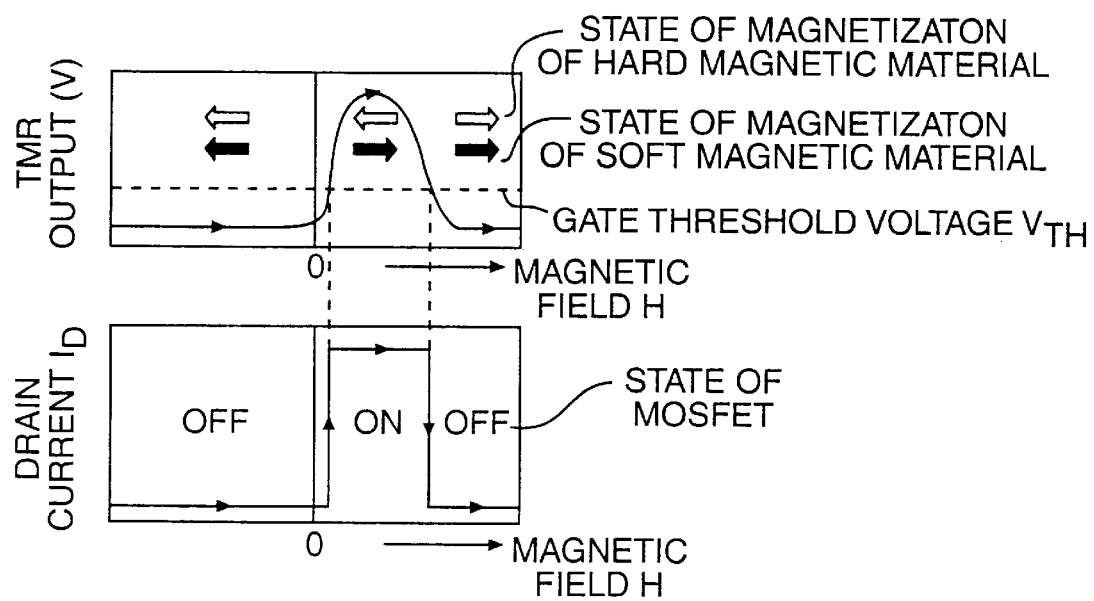

The correspondence between the TMR output/drain current and external magnetic field is shown in FIG. 3(b). The abscissa in the upper graph of FIG. 3(b) indicates the external magnetic field 800, and it is assumed that a magnetic field strong enough to saturate both the magnetic layer 200 and the magnetic gate electrode 100 is produced at the left-hand end of the graph. It is also assumed, for the convenience of description, that the magnetic gate electrode 100 is made of a hard magnetic material, whereas the magnetic material 200 is made of a soft magnetic material.

In FIG. 3(b), blank arrows indicate the direction of magnetization of the hard magnetic material in a saturated state, and solid arrows indicate the direction of magnetization of a saturated soft magnetic material. FIG. 3(b) shows that, even if the magnitude of the component of the external magnetic field 800 that is in parallel with the direction of magnetization of the two magnetic materials is reduced to zero by either changing the direction of the external magnetic field 800 or by reducing the magnitude of the external magnetic field, the directions of magnetization of the individual magnetic materials do not change. Consequently, the tunnel resistances R1 and R2 do not change, and so the TMR output voltage V 150 does not change.

However, when the magnitude of the parallel component of the external magnetic field 800 passes zero and changes its tendency, so as to rise again, the direction of magnetization of the soft magnetic material follows the direction of the external magnetic field 800, but the direction of the hard magnetic material does not change because of its coercive force. By the tunneling magnetoresistance effect, therefore, the tunnel resistance R1 550 rises depending upon the difference in the magnetization directions of the two magnetic materials. The TMR output V 150 thus rises, as shown in the upper graph of FIG. 3(b). When the magnitude of the external magnetic field 800 is increased (i.e., in the right hand direction along the abscissa) from this state, the magnetization of the hard magnetic material is gradually inverted, so that the directions of the two magnetic layers are once again parallel. As a result, the tunnel resistance R1 550 is lowered to return to its substantially initial value.

The MOSFET shown in FIG. 2 is biased under the following conditions. Specifically, the potential of the magnetic gate electrode 100 with respect to the source potential of the MOSFET, when the magnetization directions of the two magnetic materials are parallel and the TMR output V 150 is low, is less than that of the drain with reference to the source potential, a sufficient inversion layer is not formed between the source and the drain, and thus no channel is formed. Moreover, the potential of the magnetic gate electrode 100 with respect to the source potential of the MOSFET, when the magnetization directions of the two magnetic materials are closer to antiparallel and the TMR output V 150 is high, is set so that a sufficient inversion layer is formed between the source and the drain, such that a channel is formed.

As described in *Physics of Semiconductor Devices*, Chapter 8, John Wiley & Sons, New York (1981), the state in which the channel is formed is called the ON state of the MOSFET, and the state in which no channel is formed and the magnitude of the drain current is negligibly small is called the OFF state of the MOSFET. The potential of the magnetic gate electrode at the time of transition from the OFF state to the ON state is the gate threshold $V_{TH}$. As illustrated in FIG. 3(b), when the TMR output V 150 changes, the drain current $I_D$ 680 of the MOSFET changes. Specifically, when the TMR output V 150 rises to a voltage that exceeds the gate threshold $V_{TH}$, the MOSFET changes from the OFF state to the ON state, so that the drain current $I_D$ 680 abruptly rises. While the magnetization directions of the two magnetic layers are antiparallel and the TMR output V 150 is higher than the gate threshold $V_{TH}$, the MOSFET holds the ON state. When the external magnetic field 800 grows sufficiently and the magnetization directions of the two magnetic layers again approach the parallel state, the operation of the MOSFET changes to the OFF state at the moment that the TMR output V 150 becomes less than the gate threshold $V_{TH}$. This abrupt change of the drain current $I_D$ 680 is due to the effect of the amplification of the change of the TMR output V 150.

The gate threshold $V_{TH}$ can be changed by setting the bias conditions of the MOSFET appropriately. For example, by bringing the MOSFET into a state in which the magnetization directions of the two magnetic layers are parallel and the TMR output V 150 is low, and by adjusting the potential of the magnetic gate electrode 100 with respect to the source potential by setting the bias voltage U 620 to form an inversion layer previously to some extent, the MOSFET can be changed to the ON state when the magnetization direction of the magnetic layer 200 (the soft magnetic layer) is slightly turned to change the TMR output V 150 slightly. On the other hand, by bringing the MOSFET into a state in which the TMR output V 150 is low by biasing the bias voltage U 620 negatively so as not to form an inversion layer, the MOSFET does not change to the ON state so long as the magnetic layer 200 is sufficiently turned to prevent the TMR output V 150 from increasing sufficiently. In short, the gate threshold $V_{TH}$ can be changed by setting the magnitude of the bias voltage U 620 and the potential with respect to the grounding potential. In other words, the value of the TMR output V 150 (or, the external field 800) at which the MOSFET is inverted can be altered depending upon the bias settings.

This feature is quite different from conventional MR elements, in which a ferromagnetic film is formed adjacent to the MR element and the operating point is set by the magnetic bias. According to the teachings of the present invention, the ferromagnetic film that provides the magnetic bias of the conventional magnetic sensor is dispensable.

Another advantage of the present invention is that the output impedance of the device has a wide selectable range that depends upon the design of the width of the channel and the bias conditions. The output impedance range is wide because the drain bias terminal is connected to the external circuit, and the drain current is used as the output signal of the element. As a result, the output impedance of the element is determined by the impedance between the source and the drain. Because the output impedance of the element has a wide selectable range, the prior art problem of impedance matching between the TMR element and the external circuit is solved.

Further, the gate of the MOSFET, which is conventionally made of polysilicon, is instead constituted by the magnetic gate electrode 100, which has a potential that fluctuates according to the TMR effect. Thus, the invention is different from the (apparently) similar device that might be constructed by connecting the output of the separately-prepared TMR element to the polysilicon gate of a conventional MOSFET by a metallic wiring or the like. The invention is different because the coupling of the magnetic gate electrode 100 and the channel according to the invention is simply a capacitive coupling through the gate oxide film 500, so that no wiring realizes the electrical connection of the electrode and channel. By comparison with the apparently, but not truly, similar device, the invention has remarkably reduced noise that might otherwise enter due to the presence of the wiring.

In the device of FIG. 2, there are two tunnel barriers in the current path that extends from the nonmagnetic layer 400 fed with the bias voltage U to the magnetic layer 200 through the tunneling oxide film 300 and the magnetic gate electrode 100. The voltage division ratio 1/(1+R2/R1) of the bias voltage U is determined by the ratio R2/R1 of the two resistances but not by the absolute values of the resistances. The two tunnel barriers are created by the common tunneling oxide film 300 formed over the magnetic gate electrode 100. If the tunneling oxide film 300 has a uniform thickness over the two junctions, therefore, the tunnel resistances of the tunnel barriers are substantially determined by the degrees of overlap (i.e., the size of the junction area) of the magnetic gate electrode 100 and the magnetic layer 200, and of the magnetic gate electrode 100 and the nonmagnetic layer 400. In other words, the voltage division ratio 1/(1+R2/R1) of the bias voltage U is determined exclusively by the ratio of the junction area if the uniformity of the thickness of the tunneling oxide film 300 is ensured.

The junction area can be sufficiently precisely controlled by using a micro processing technique based on lithography. Hence, even though the reproducibility of the average thickness of the tunneling oxide film 300 formed at the time of element fabrication is low, a division ratio 1/(1+R2/R1) that has an extremely small variation among the elements can be achieved if the uniformity of the film is ensured. By this feature, the invention accomplishes the goal of reducing the characteristic variation among elements in mass production.

Specific examples of preferred embodiments of the invention follow.

Embodiment 1

FIGS. 4(*a*)–4(*f*) show a process for manufacturing a MOSFET tunneling magnetoresistance element according to the invention. FIGS. 4(*a*), 4(*c*), and 4(*e*) are cross sections of the element during the manufacturing process, and FIGS. 4(*b*), 4(*d*), and 4(*f*) are top plan views from which the cross sections are taken.

FIGS. 4(*a*) and 4(*b*) show the state of an ordinary MOSFET manufacturing process, in which a P-type silicon substrate 700 is partially oxidized to form a thick oxide film region 510, heavily-doped regions (i.e., a source region 710 and a drain region 720) are formed by conventional lithography patterning, and a thin gate oxide film 500 is grown and patterned to form contact holes in the heavily-doped region.

Next, as shown in FIGS. 4(*c*) and 4(*d*), a magnetic gate electrode 100 is formed over the oxide film region 510, and a tunneling oxide film 300 is formed over the magnetic gate electrode 100. In this embodiment, the material of the magnetic gate electrode 100 is Co-17at%Pt. Alternatively, a hard magnetic material of a Co alloy such as Co—Cr—Ta alloy can be employed as the material of the magnetic gate electrode 100. A multilayered structure of, for example, Ni—Fe/Mn-20at%Ir/Cu/Hf/SiO$_2$/Si (substrate) can also be used as the magnetic gate electrode 100, to take advantage of the property that an antiferromagnetic material fixes the magnetized state of a ferromagnetic material. In this example, the Cu/Hf layers are introduced to control the preferred orientation of the crystal of the antiferromagnetic layer Mn-20at%Ir.

A tunneling oxide film 300 is preferably formed by a method of forming a metal film on aluminum as thin as about 1 to 2 nanometers, and then oxidizing the metal film either in an oxygen atmosphere or with an oxygen plasma. The oxide film can also be a metal oxide of Si, Ge, Zr, or Hf. The tunneling oxide film 300 thus formed has a substantially uniform thickness over the magnetic gate electrode 100.

Moreover, a magnetic layer 200 and a nonmagnetic layer 400 are formed to form two tunnel junctions over the magnetic gate electrode 100 (FIGS. 4(*e*) and 4(*f*)). The magnetic layer 200 can be made of a soft magnetic material such as Ni-20at%Fe, Ni-16at%Fe-18at%Co, or Co-10at%Fe. Similar tunneling magnetoresistance effects can be achieved by using the hard magnetic materials discussed above with respect to the magnetic gate electrode 100 for the magnetic layer 200 instead, and the above-mentioned soft magnetic materials for the magnetic gate electrode 100. That is, the magnetic gate electrode 100 and the magnetic layer 200 can be of hard and soft magnetic materials, respectively, or of soft and hard magnetic materials, respectively.

A nonmagnetic metallic wiring material (e.g., Al, W, or Cu) can be employed for the nonmagnetic layer 400, as is typical in conventional semiconductor manufacture.

Figure 4A:
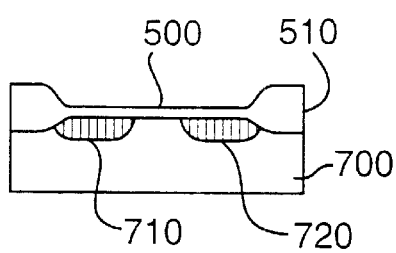
FIGS. 4(*a*)–4(*f*) show a manufacturing process of one embodiment of the invention.
Figure 4B:
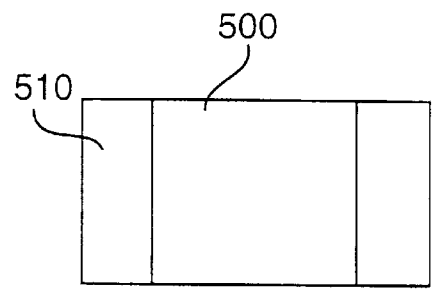
Figure 4C:
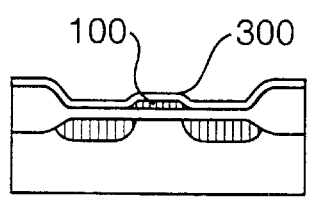
Figure 4D:
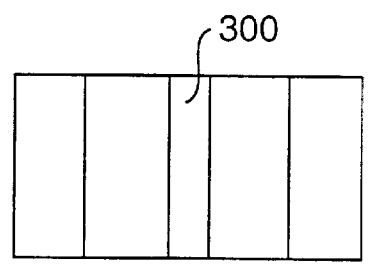
Figure 4E:
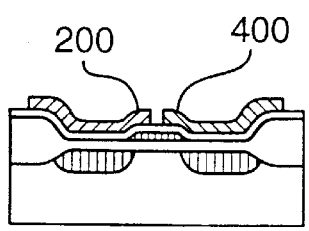
Figure 4F:
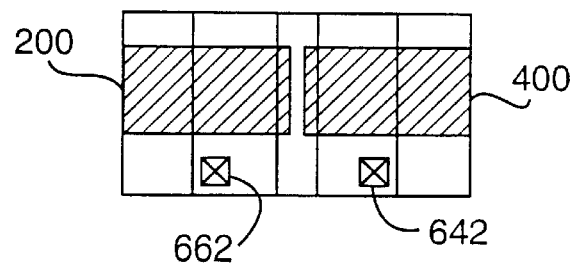

Following the formation of the layers 200, 400, an element having five terminals (neglecting the substrate bias terminal) is fabricated by forming contact holes 662 and 642 (FIG. 4(f)), by wiring the source region 710 and the drain region 720 with a metal, and by wiring the magnetic layer 200 and the nonmagnetic layer 400. The resulting structure is that shown in FIG. 2, discussed above.

The magnetic sensor constructed according to the teachings of this embodiment has a much higher signal-to-noise ratio, by 100 or more times, compared with the TMR sensor of the prior art. By the TMR effect, a change in the external magnetic field generates a signal or a potential change of the magnetic gate electrode 100. This change causes a change in the drain current, thereby generating a detection signal representative of the change in the external magnetic field. Since this signal generating portion is incorporated in the MOSFET structure, according to the invention, the generated signal is instantly amplified in the element without being mixed with noise. Thus, the signal-to-noise ratio is improved.

An equivalent circuit that is apparently similar to that of FIG. 3(a) can be produced by connecting one end of the metallic wire (i.e., not through the gate oxide film 500) to the magnetic gate electrode 100 and by connecting the magnetic material-magnetic material tunnel junction and the magnetic material-nonmagnetic material tunnel junction in parallel to the other end. However, the structure according to the present embodiment is different, as is apparent from the foregoing description of the manufacturing process, from this perceived alternative in that the magnetic material-magnetic material and magnetic material-nonmagnetic material tunnel junctions must be formed in pairs. In particular, this restriction produces the effect of suppressing the variation of the voltage division ratio $1/(1+R2/R1)$ among plural elements in mass production. Moreover, the presence of the metallic wiring raises the probability of adding noise to the signal, which deteriorates the signal-to-noise ratio.

Embodiment 2

FIGS. 5(a)–5(f) show a second embodiment of the invention, based on a different manufacturing process from that of Embodiment 1. In Embodiment 1, there are four independent electrical wirings to the source region 710, the drain region 720, the magnetic layer 200, and the nonmagnetic layer 400. In the present embodiment, the source region 710 and a nonmagnetic layer 410 are connected inside the element, and the drain region 720 and a magnetic layer 210 are connected inside the element.

Figure 5A:
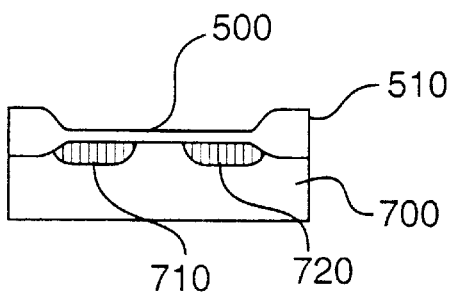
FIGS. 5(*a*)–5(*h*) show a manufacturing process according to another embodiment of the invention.
Figure 5B:
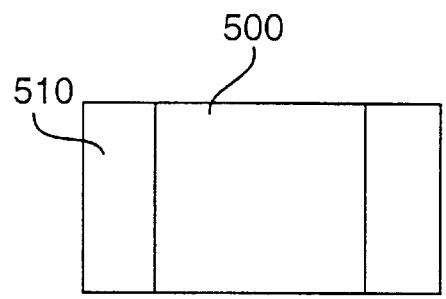
Figure 5C:
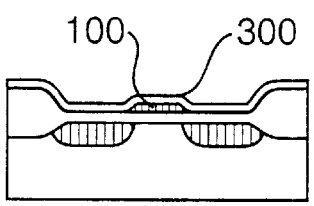
Figure 5D:
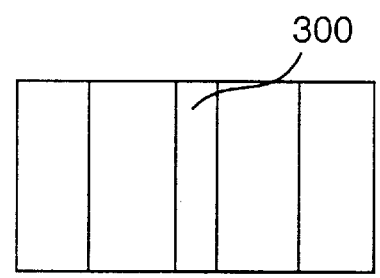
Figure 5E:
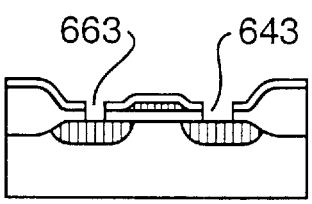
Figure 5F:
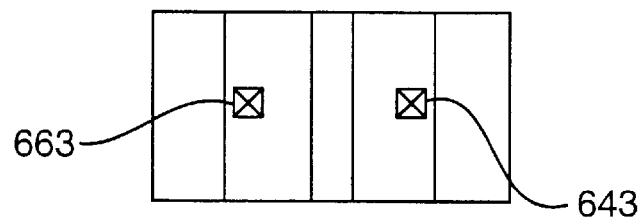

FIGS. 5(a)–5(b) and 5(c)–5(d) show process steps that are similar to those of FIGS. 4(a)–4(b) and 4(c)–4(d), respectively. In FIGS. 5(e) and 5(f), the magnetic layer 210 and the nonmagnetic layer 410 are individually formed by forming a contact hole 663 leading to the source region 710 and a contact hole 643 leading to the drain region 720, through the gate oxide film 500 and the tunneling oxide film 300. The magnetic layer 210 and the nonmagnetic layer 410 are individually connected to a drain and source biasing external circuit. The magnetic layer 210 and the nonmagnetic layer 410 are constituted by the materials employed for the magnetic layer 200 and the nonmagnetic layer 400 in Embodiment 1.

Figure 5G:
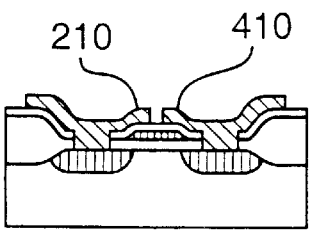
Figure 5H:
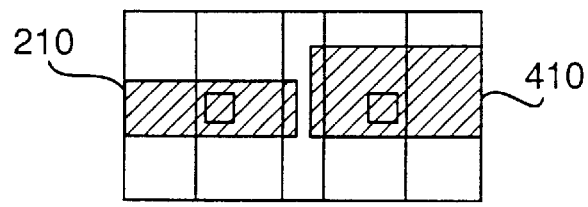

In the present embodiment, the bias between the source and drain and the bias of the TMR element section having the two tunnel junctions are fed from one external circuit. As a result, the magnitude of the gate bias by the magnetic gate electrode 100 is determined directly by the voltage division ratio $1/(1+R2/R1)$. Therefore, it is necessary to set the ratio R2/R1 of the tunnel resistances so as to provide a satisfactory gate bias. This ratio R2/R1 is determined by the ratio of the junction areas (i.e., the ratio of the overlap between the magnetic gate electrode 100 and the magnetic layer 210 or the nonmagnetic layer 410, as described above with respect to Embodiment 1). In the present embodiment, therefore, the magnetic layer 210 and the nonmagnetic layer 410 have different widths, such that their magnitude ratio is the desired ratio R2/R1, as shown in FIGS. 5(g)–5(h).

By reducing the four wiring terminals of Embodiment 1 to the two wiring terminals of the present embodiment, the element designed and manufacturing process are simplified.

Embodiment 3

The present embodiment is directed to an application of the inventive TMR element to a magnetic memory.

Figure 6A:
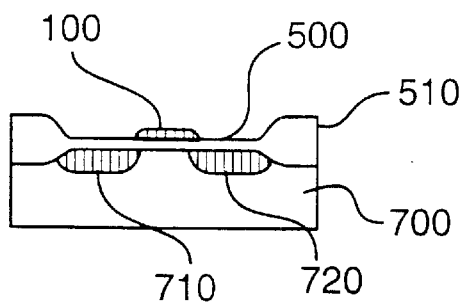
FIGS. 6(*a*)–6(*h*) show a manufacturing process for a magnetic memory according to an embodiment of the invention.
Figure 6B:
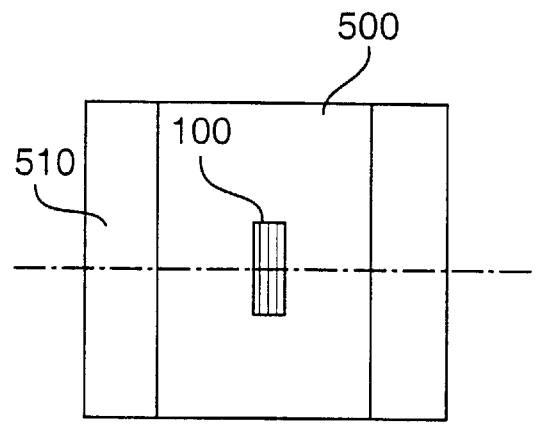
Figure 6C:
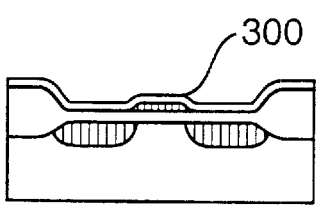
Figure 6D:
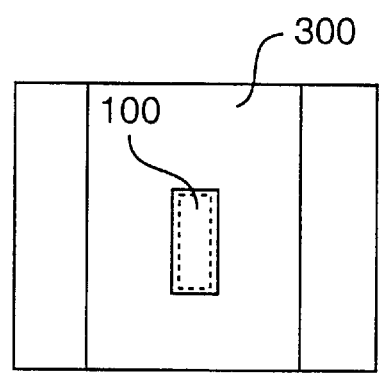
Figure 6E:
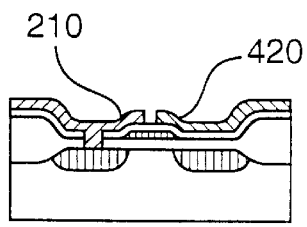
Figure 6F:
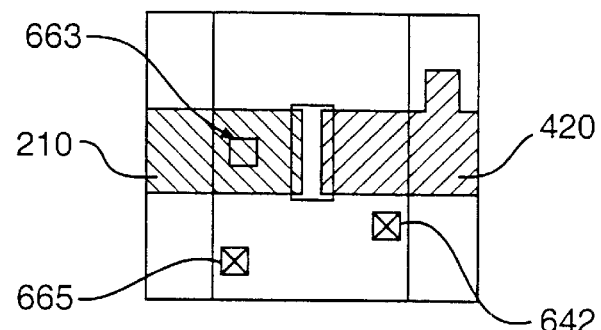
Figure 6G:
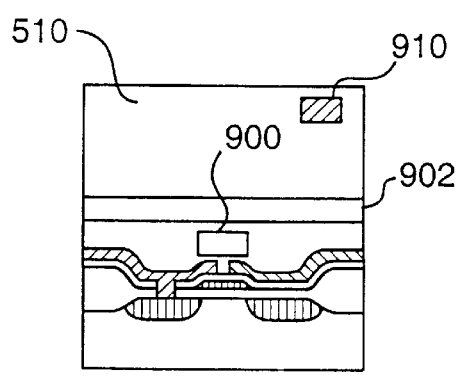
Figure 6H:
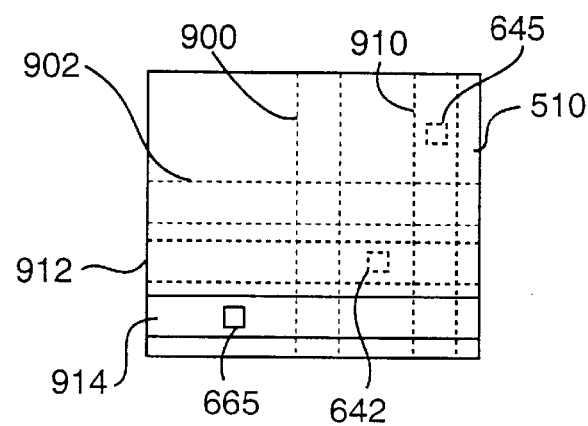

FIGS. 6(a)–6(f) show the construction of a MOSFET tunneling magnetoresistance element fabricated by the process shown in FIGS. 4(a)–4(f) and FIGS. 5(a)–5(h). FIGS. 6(a), 6(c), 6(e), and 6(g) are sections taken along the center lines of the top plan views shown in FIGS. 6(b), 6(d), 6(f), and 6(h). In FIGS. 6(e) and 6(f), the magnetic layer 210 and the source region 710 are connected through the contact hole 663 extending through the gate oxide film 500. A nonmagnetic layer 420, however, is not connected to the drain region 720 via a contact hole beneath it, but independently through a contact hole 642.

In this embodiment, moreover, a metal wiring is provided over the two tunnel junctions. The metal wiring is buried in the insulator layer 510, and is a writing line 900. Over this writing line 900 is formed a metal wiring which is perpendicular to the writing line 900 and which is a writing bias line 902. These two wiring lines are arranged as close to the magnetic layer 210 and the nonmagnetic layer 420 as possible, within a range capable of ensuring insulation.

The writing line 900 is formed above the surface of the magnetic gate electrode 100 by about 30 nanometers and the writing bias line 902 is formed above the writing line 900 by about 20 nanometers. To the insulator layer 510, moreover, is provided a metal wiring through a contact hole 645. This metal wiring is a word line 910, for applying a bias to the nonmagnetic layer 420, and is parallel with the writing line 900.

Through the contact hole 642, a metal wiring is provided to the drain region 720. This wiring is a data line 912, and is perpendicular to the writing line 900 and the word line 910, and parallel with the writing bias line 902. Moreover, the magnetic layer 210 and the source region 710 are biased and connected by a metal wiring through a contact hole 665. This metal wiring is a grounding line and is parallel with the data line 912. All of the metal wirings (i.e., the writing line 900, the writing bias line 902, the word line 910, the data line 912, and the grounding line 914) are buried at different levels in the insulator layer 510.

The resulting structure is a magnetic memory cell. In this magnetic memory cell, information of a single bit is stored in a manner to correspond to the state of magnetization of the magnetic gate electrode 100. The magnetic gate electrode 100 is magnetized by a magnetic field which is induced by allowing an electric current to flow through both the writing line 900 and the writing bias line 902. In order to change the magnetic gate electrode 100 from a particular magnetized state to the magnetically inverted state, an electric current of the opposite polarity may be made to flow through both the writing line 900 and the writing bias line 902. If the coercive force of the magnetic gate electrode 100 is sufficiently strong, the magnetization is not inverted by the current bias of only one of the writing line 900 and the writing bias line 902.

In the present embodiment, cobalt is preferably employed in the magnetic gate electrode 100.

By the tunneling magnetoresistance effect, the change in the magnetization state of the magnetic gate electrode 100 changes the tunnel resistance R2 between the magnetic layer 200 and the magnetic gate electrode 100, thereby changing the voltage division ratio $1/(1+R2/R1)$. This change leads to a change in the potential, established when the word line 910 leading to the nonmagnetic layer 420 is biased, of the magnetic gate electrode 100, which acts as the gate electrode of the MOSFET. As a result, the change in the magnetization state of the magnetic gate electrode 100 is observed as a change in the drain current which is achieved by biasing the data line 912 leading to the drain region 720. If the voltage division ratio is suitably set, the drain current changes between two values, from zero to a sufficiently large finite value in accordance with the magnetization state of the magnetic gate electrode 100. Hence, the change in the drain current functions as a current signal representing the information of a bit which is stored as the state of magnetization of the magnetic gate electrode 100.

A magnetic random access memory (MRAM) can be formed by arranging an array of the memory cells shown and described, and by providing one writing line 900 and one word line 910 to each column of memory cells in the array, and one writing bias line 902, one data line 912, and one grounding line 914 for each row of memory cells in the array. In order to write to a specific cell of the array, the writing bias line 902, shared by the row to which the cell belongs, is energized first to establish an induction field.

In this state, the intensity of the induction field is so strong that the magnetization of the magnetic gate electrode 100 is not inverted. Subsequent to this state, the writing line 900, shared by the column to which the cell belongs, is energized. As a result, a magnetic field is generated that is strong enough to invert the magnetization of the magnetic gate electrode 100 in the selected cell, to complete the writing operation.

To read the information in a specific cell in the array, the word line 910, shared by the column to which the cell belongs, is biased, the word lines of the other columns are grounded, and only the data line 912 shared by the row to which the cell belongs is biased, while the other data lines are grounded.

As compared with the conventional DRAM, in which information is stored in the form of a charge stored in a capacitor, the magnetic memory element that forms the basis of the present embodiment has the feature that the information is not lost due to the coercive force of the magnetic gate electrode 100, even if the power supply from the external circuit is interrupted. In this sense, the MRAM constructed of the present magnetic memory cells is a nonvolatile RAM.

By applying current pulses of about 1 nanosecond to the writing line 900, the state of magnetization of the magnetic gate electrode 100 is inverted. Thus, the writing operation can be performed at a speed equal to or higher than that of the DRAM of the prior art. The MRAM of the present invention is superior to a nonvolatile flash memory with respect to this high speed writing operation.

It is noted that the present invention provides a magnetic memory element which is different in construction from the device disclosed in U.S. Pat. No. 5,654,566. The device shown in this U.S. patent makes use of spin conservation of current carriers flowing between the source and the drain, whereas the present invention is based on the principles of the tunneling magnetoresistance effect. In the construction of the element according to the present invention, the signal generated by the TMR effect is amplified and output. However, although a FET is employed in the device disclosed in U.S. Pat. No. 5,654,566, such an amplification effect and the resultant improvement in signal-to-noise ratio cannot be expected.

The variation of characteristics of elements adopting the TMR effect generally depends on the controllability of the tunneling oxide film 300. However, the present invention is greatly improved with respect to varying characteristics because of the manufacturing method disclosed above. The device disclosed in the aforementioned U.S. patent employs spin conservation, and has an essentially indefinite controllability of variation of characteristics; moreover, the patent fails to describe or suggest the method disclosed above. Reduction in the variations of characteristics in the prior art is an important objective of the present invention and an important improvement in the art, particularly for integrating a multiplicity of magnetic memories.

Embodiment 4

The present embodiment is directed to an application of the present invention to a magnetic head employing a TMR element.

Figure 7:
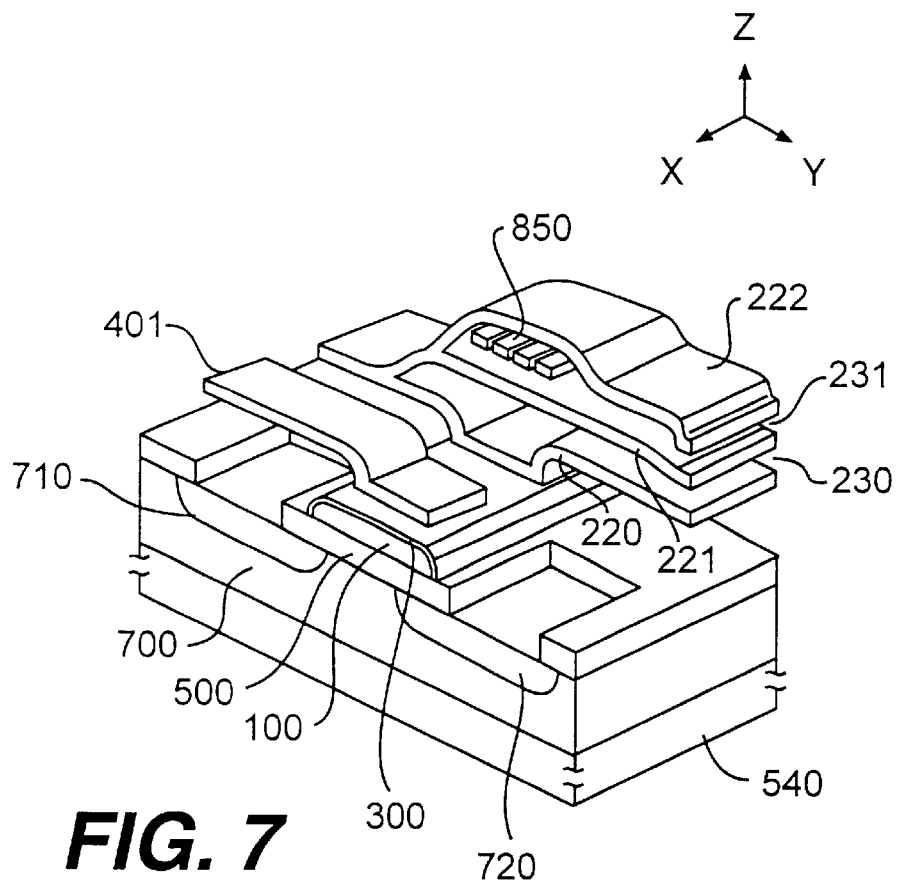
FIG. 7 is a conceptual diagram showing a tunneling magnetoresistance element according to the invention used in a yoke-type read/write head.

FIG. 7 shows a conceptual diagram of an embodiment according to the invention, in which a TMR element is employed in a read/write head used for reading and writing information from and to a magnetic recording medium. FIG. 7 shows only the major magnetic poles and the electrode structure.

The reading head comprises a magnetic sensor that uses a tunnel junction-type magnetoresistance element and a yoke-type head. In FIG. 7, the recording medium is in the Z-X plane as defined in the figure, and the head makes access to the medium surface in a direction parallel to the Y-axis, which is perpendicular to the recording medium. The reading head has a reading gap 230 which is formed by a lower yoke structure 220 and an upper yoke structure 221, and the writing head has a writing gap which is positioned over the reading gap and formed by a magnetic pole 222 and the upper yoke structure 221. A writing coil 850 is interposed between the magnetic pole 222 and the upper yoke structure 221.

The lower yoke structure 220 is in partial contact with the tunneling oxide film 300, to form a tunnel junction between the lower yoke structure 220 and the magnetic gate electrode 100. Similarly, a nonmagnetic electrode 401 is in contact at an end portion thereof with the tunneling oxide film 300, to form a tunnel junction between the nonmagnetic electrode 401 and the magnetic gate electrode 100. Under the magnetic gate electrode 100, there is a gate oxide film 500, under which is formed a channel sandwiched between the source and drain of the MOSFET, thus resulting in a construction that is somewhat similar to that shown in FIG. 2. The head structure, including the yoke structure described above, can be easily made by combining suitable planarizing and metalizing techniques for an oxide film in semiconductor manufacture. This entire head structure is preferably applied to a strength reinforcing layer 540 of $Al_2O_3TiC$, and used as a combination read/write head.

For a tunnel resistance R1 of the tunnel junction formed between the lower yoke structure 220 and the magnetic gate electrode 100, and a tunnel resistance R2 of the tunnel junction formed between the end portion of the nonmagnetic electrode 401 and the magnetic gate electrode 100, an equivalent circuit like that shown in FIG. 3(*a*) can also be devised for the present embodiment. The lower yoke structure 220 is preferably made of a soft magnetic material such as Permalloy the lower yoke structure 220 and corresponds to the magnetic layer 200 of Embodiment 1. The magnetization direction of the yoke structure 220 changes with a change in the magnetic field generated as a result of a movement (rotation, in the case of a magnetic disk) of the recording medium. The magnetic gate electrode 100 is preferably made of a hard magnetic material of Co-17at%Pt in this embodiment.

The input/output characteristics of the read head of this embodiment are determined as in Embodiment 1 by the potentials of and the potential difference between the source region 710 and the drain region 720 with respect to the lower yoke structure 220, and by the bias voltage U 620 applied between the lower yoke structure 220 and the nonmagnetic layer electrode 401. The output signal is the drain current flowing through the drain region 720.

By comparison with the yoke-type MR head described in Mallinson, "*Magnetoresistant Head—Fundamentals and Applications*", translated by Hayashi, Maruzen (1996), pages 74–75, the present invention has a much higher junction efficiency between the yoke structure and the magnetoresistive element, because the Mallinson MR element is extremely thin. Since the MR element and the yoke structure must be electrically isolated, moreover, they are required to have sufficient gaps, which further lowers the junction efficiency of the magnetic flux in the Mallinson device. The combined yoke structure and MR element, therefore, has a high magnetic reluctance for the entire head structure, lowering the magnetic flux efficiency with respect to the recording medium.

According to the present embodiment, on the other hand, no gap is required in the lower yoke structure 220, which also reduces the thickness of the device. Thus, the magnetic reluctance of the entire head structure according to the present invention can be held at a low level to avoid the problems of the prior art.

Embodiment 5

A further example of applying the TMR element of the present invention to a magnetic head follows.

Figure 8:
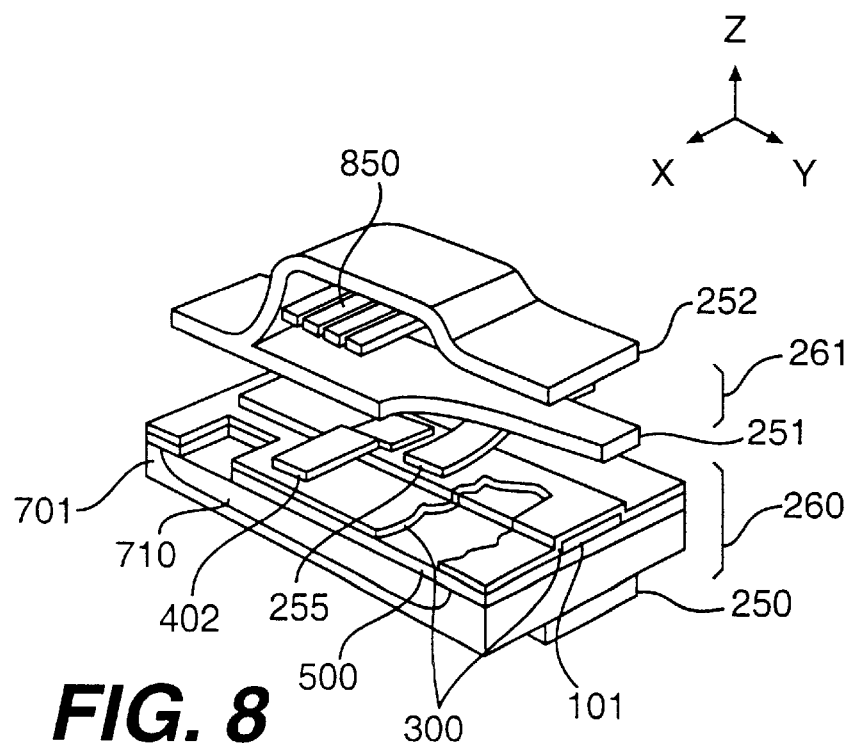
FIG. 8 is a conceptual diagram showing a tunneling magnetoresistance element according to the invention used in a shield-type read/write head.

FIG. 8 shows a conceptual diagram of another embodiment according to the present invention, as applied in a read/write head for reading information from and writing information to a magnetic recording medium.

FIG. 8 shows only the major magnetic poles in the electrode structure. The read head includes a magnetic sensor that uses a tunnel junction-type MR element and a shield-type head. In FIG. 8, the recording medium is placed in the Z-X plane as defined in the figure, and the head makes access to the medium surface in a direction parallel to the Y-axis, which is perpendicular to the recording medium. The read head has a reading gap 260 which is formed by a lower shield 250 and an upper shield 251, and the write head has a writing gap formed by an upper magnetic pole 252 and the upper shield 251. A writing coil 850 is interposed between the upper magnetic pole 252 and the upper shield 251.

A soft magnetic gate electrode 101 is disposed at a generally intermediate position between the upper shield 251 and the lower shield 250. The tunneling oxide film 300 is formed over the soft magnetic gate electrode 101, and the channel portion of the MOSFET is disposed under the gate electrode with the gate oxide film 500 therebetween. A hard magnetic electrode 255 is in contact at an end portion thereof with the tunneling oxide film 300 to form a tunnel junction between the hard magnetic electrode 255 and the soft magnetic gate electrode 101. Similarly, a nonmagnetic electrode 402 is in contact at an end portion thereof with the tunneling oxide film 300 to form a tunnel junction between the nonmagnetic electrode 402 and the soft magnetic gate electrode 101.

Figure 9:
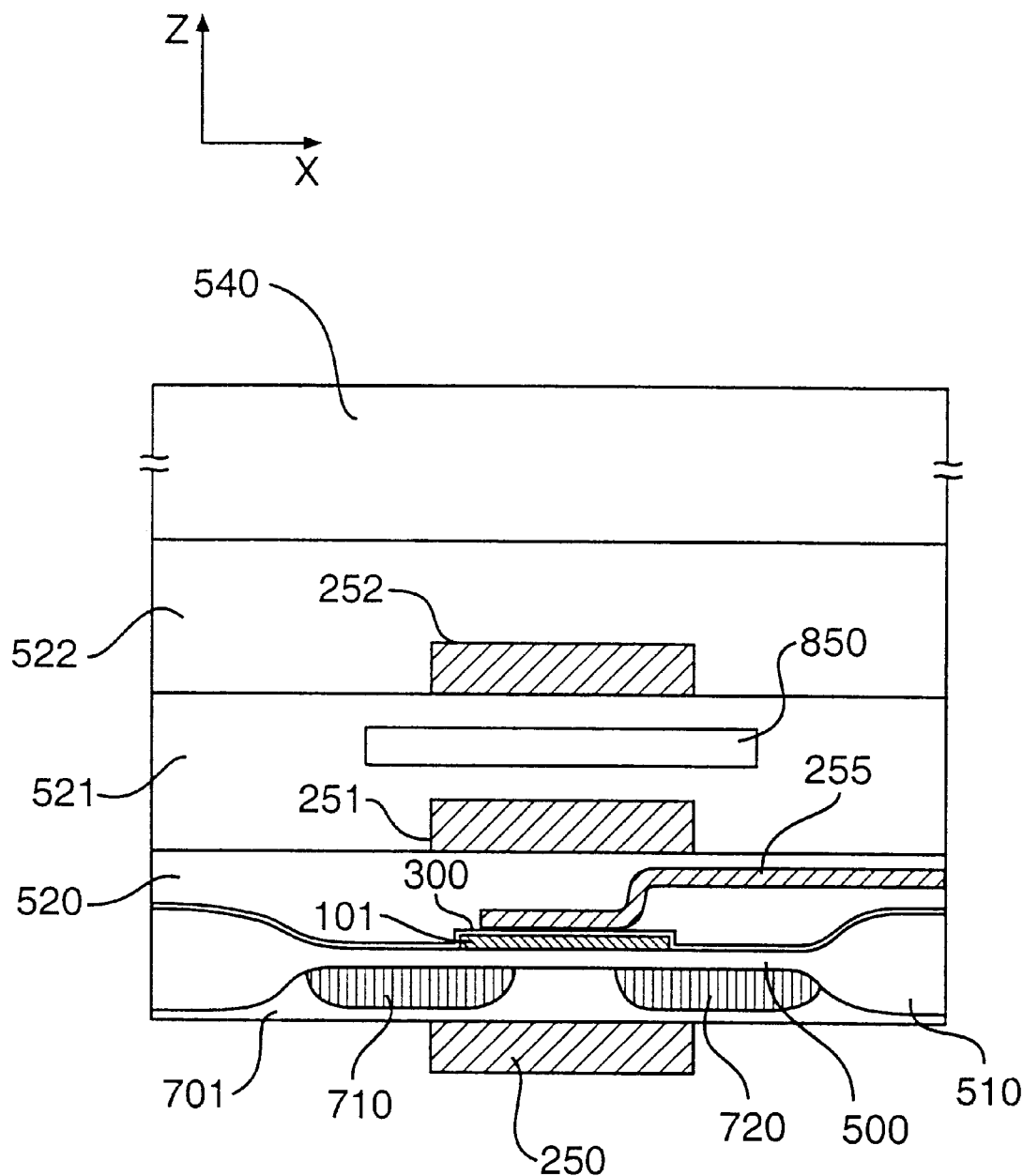
FIG. 9 is a cross section showing the construction of the tunneling magnetoresistance element used in the shield-type read/write head of FIG. 8.

As illustrated in FIG. 8, the source region 710 of the MOSFET is in front of the soft magnetic gate electrode 101. Contact holes extend through the tunneling oxide film 300 and the gate oxide film 500 to a part of the source region 710. The drain region 720 is located, but not illustrated, on the opposite side of the soft magnetic gate electrode 101 from the source region 710. As for the source region 710, contact holes extend to the drain region 720. FIG. 9, which illustrates a cross section taken parallel to the Z-X plane through hard magnetic electrode 255, makes the construction more clear. The channel portion formed between the source region 710 and the drain region 720 of the MOSFET is provided in parallel (i.e., in the Z-X plane) with the plane that includes the recording medium.

As shown in FIG. 9, the metallic portion such as the soft magnetic gate electrode 101, the individual shields, and the magnetic holes, are buried in an interlayer insulating layer 520, an interlayer insulating layer 521, and an interlayer insulating layer 522. Moreover, the magnetic poles and the shields are fabricated by combining a planarizing technique and a metallization technique used for manufacturing oxide films in the semiconductor industry. The entire head structure is preferably attached to a strength reinforcing layer 540 of $Al_2O_3$—TiC or the like, to complete the read/write head.

FIGS. 10(*a*)–10(*d*) schematically illustrate important steps of the manufacturing process. FIGS. 10(*a*)–10(*d*) are sections taken perpendicular to the recording medium, parallel to the Z-Y plane, through the soft magnetic gate electrode 101.

FIG. 10(*a*) illustrates the device during manufacture, immediately after the magnetic sensor unit according to the present invention has been manufactured over the MOSFET. The MOSFET is preferably manufactured over a Silicon-On-Insulator (SOI) substrate. This SOI substrate is preferably a Separation-by-Implanted-Oxygen (SIMOX) substrate, in which a buried oxide film layer is formed by oxygen implantation and by subsequent heat treatment. The SOI substrate includes a buried oxide layer 702 formed over an Si substrate 703, and an upper Si layer 701 formed over the oxide layer 702. The upper Si layer 701 should be of sufficiently high quality Si so that a proper MOSFET can be formed.

The tunneling oxide film 300 is formed, and the hard magnetic electrode 255 and nonmagnetic electrode 402 are formed on the tunneling oxide film 300. These electrode structures are then buried in the interlayer insulating layer 520 and planarized at their upper portions by a Chemical-Mechanical Polishing (CMP) method or the like. By similar metallizations and planarizing techniques, the upper shield 251, the upper magnetic poles 252, the recording coil 850, and so on are formed and are buried in the interlayer insulating layers 521, 522. The strength reinforcing layer 540 is formed thereover, as shown in FIG. 10b.

Next, the Si substrate 703 and the buried oxide layer 702 are removed from the back face. For this removal, a wet etching of the Si substrate 703 with hydrazine or a wet etching of the buried oxide layer 702 with hydrofluoric acid may be employed. The strength reinforcing layer 540 can be masked against this etching. See FIG. 10(c).

Figure 10A:
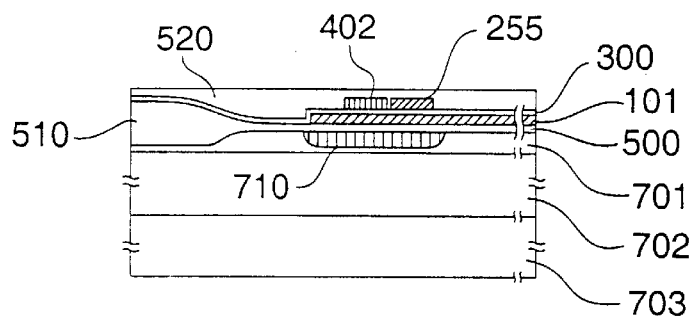
FIGS. 10(*a*)–10(*d*) are sections showing a manufacturing process for a read/write head, in which a tunneling magnetoresistance element according to the invention is used in a shield-type read/write head.
Figure 10B:
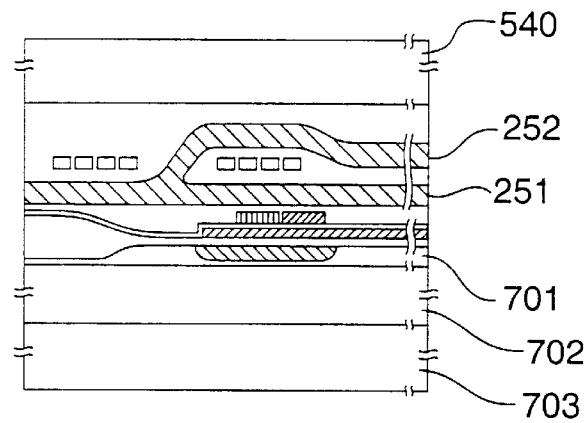
Figure 10C:
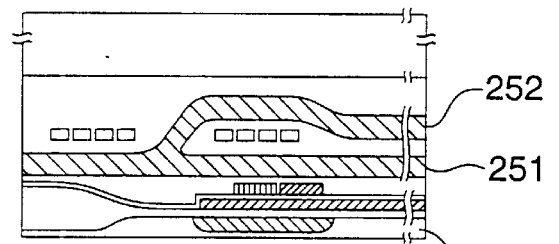
Figure 10D:
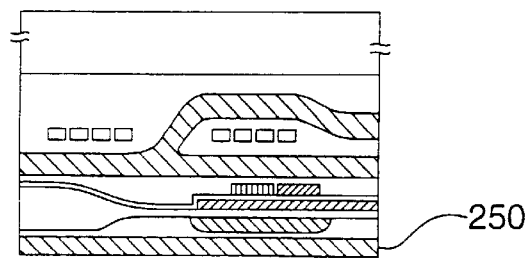

Thereafter, the process is completed by forming the shield 250 on the back face (FIG. 10(b)).

An equivalent circuit, like that shown in FIG. 3(a), can be formed for this embodiment as well, by defining the tunnel resistance R1 of the tunnel junction formed between the hard magnetic electrode 255 and the soft magnetic gate electrode 101, and the tunnel resistance R2 of the tunnel junction formed between the nonmagnetic electrode 402 and the soft magnetic gate electrode 101. The soft magnetic gate electrode 101 is preferably made of a soft magnetic material such as Permalloy, so that the direction of magnetization changes with the change in magnetic field generated as a result of the movement (rotation, for a magnetic disk) of the recording medium. The hard magnetic electrode 255 is preferably made of a hard magnetic material of Co-17at%Pt in this embodiment.

The input/output characteristics of the read head according to this embodiment are determined in the same manner as in Embodiment 1 by the potentials of and the potential difference between the source region 710 and the drain region 720 with respect to the hard magnetic electrode 255, and by the bias voltage U 620 applied between the hard magnetic electrode 255 and the nonmagnetic electrode 402. The output signal is the drain current flowing through the drain region Embodiment 6

Figure 11:
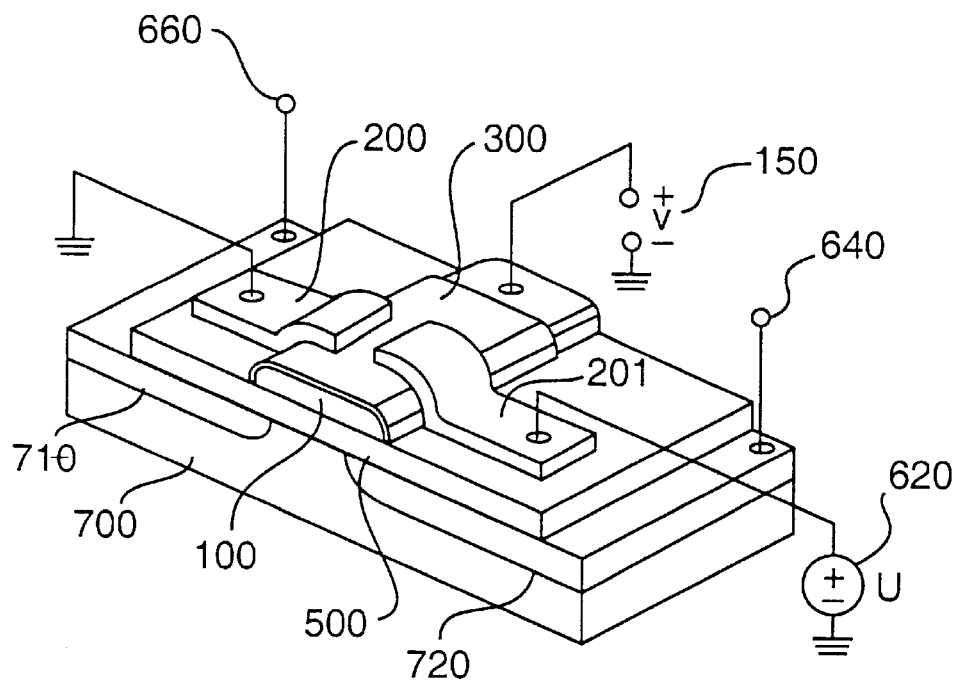
FIG. 11 is a conceptual diagram showing another embodiment of a magnetoresistance element according to the invention.
Figure 12:
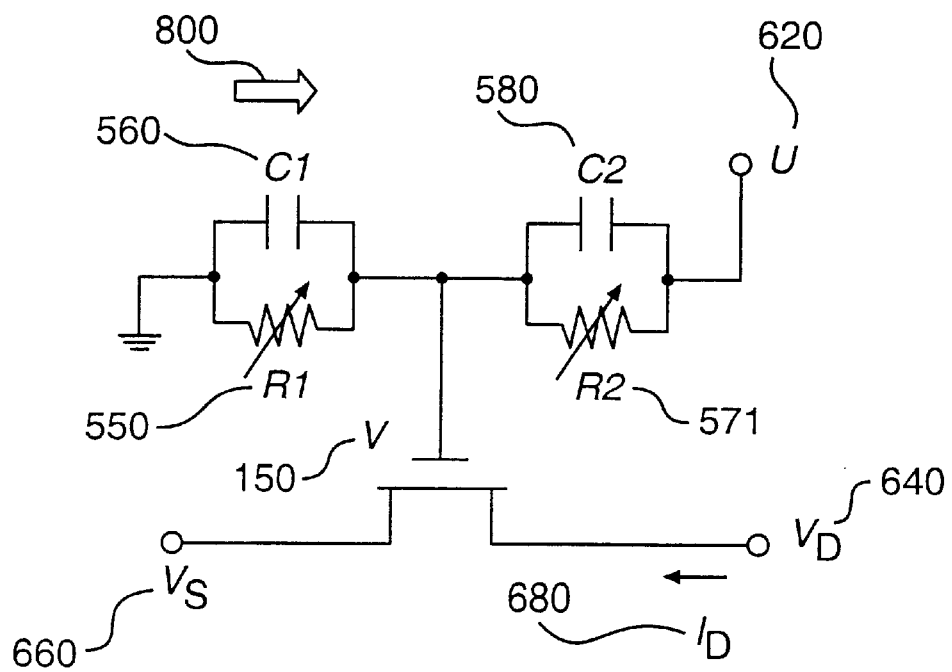
FIG. 12 is an equivalent circuit employing the magnetoresistance element of FIG. 11.

An MR element having a structure substantially similar to that shown in FIG. 2 was manufactured, as shown in FIG. 11. However, in this embodiment, the nonmagnetic layer 400 of FIG. 2 is replaced by a magnetic layer 201, as shown in FIG. 11. An equivalent circuit, as shown in FIG. 12, is substantially similar to that of FIG. 3(a), in which the tunnel resistance R2 570 is fixed, but the tunnel resistance R2 571 in FIG. 12 is made variable because of the different structure.

In the MR element shown in FIG. 11, the tunnel resistance R1 550 and the tunnel resistance R2 571 change with a change in the magnetic field, such that the voltage V 150 changes. Like the MR element of FIG. 2, therefore, the magnitude of the magnetic field can be detected in terms of the change in the drain current 680.

Figure 13:
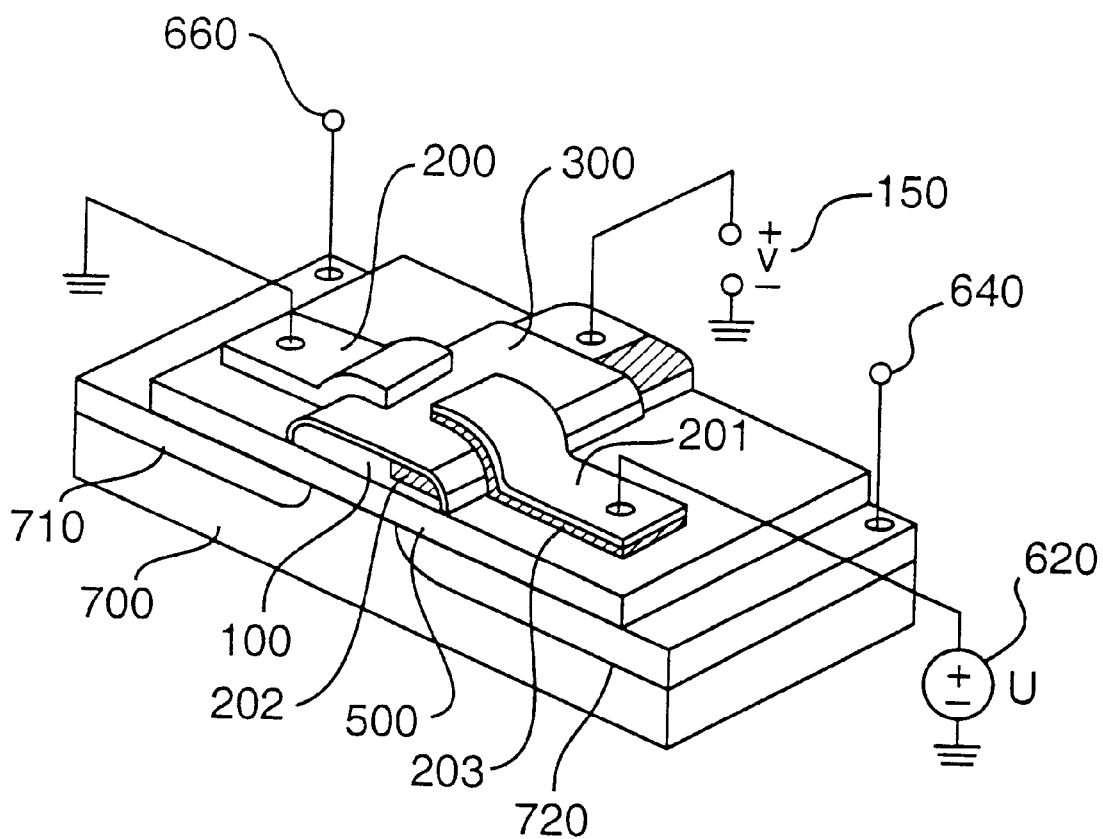
FIG. 13 is a conceptual diagram of another magnetoresistance element according an embodiment of the present invention.

Moreover, an MR element shown in FIG. 13 was also manufactured. In this element, a magnetic layer 202 is laminated over a portion of the magnetic gate electrode 100. If the magnetic layer 202 has a thickness of about 1 mm, its intrinsic coercive force does not exert any influence upon the coercive force of the magnetic gate electrode 100. Since the magnetic gate electrode 100 and the magnetic layer 202 are in direct contact with each other, their magnetizations are inverted in a common magnetic field. If the magnetic gate electrode 100 is made of a material having a high coercive force, therefore, the directions of magnetization of the magnetic gate electrode 100 and the magnetic layer 202 do not change in a small magnetic field, regardless of the value of the coercive force of the magnetic layer 202.

In the MR element shown in FIG. 13, moreover, a magnetic layer 203 is also formed under the magnetic layer 201. The magnetic layer 202 and the magnetic layer 203 are preferably made of the same material. As shown in FIG. 13, the magnetic layer 202 and the magnetic layer 203 oppose each other, separated by the tunneling oxide film 300. If the magnetic layers 202, 203 are made of a Fe—V alloy, a negative magnetoresistance effect is established in the tunnel current between them. In the equivalent circuit shown in FIG. 12, therefore, the change in the tunnel resistances R1 550 and R2 571 are in opposite directions at all times. Specifically, when the tunnel resistance R1 550 increases, the tunnel resistance R2 571 decreases. When the tunnel resistance R1 550 decreases, conversely, the tunnel resistance R2 571 increases. By this effect, the change in the voltage V 150 is larger than that in the voltage V 150 or the magnetoresistance element of FIG. 2. This indicates that the magnetoresistance element has a higher sensitivity according to this present embodiment.

According to the teachings of the present invention, a magnetic sensor and a magnetic read/write head can be produced, which can match the impedance of an external circuit, and which can have a remarkably high signal-to-noise ratio, on the order of 100 times as high as that of the prior art. Moreover, the present invention, when applied to mass production of semiconductor elements, features extremely small variations in characteristics among the elements produced. By exploiting this feature, a nonvolatile and fast (i.e., 10 nanoseconds writing/reading time) memory cell and memory array having integrated memory cells can be manufactured.

Various embodiments of the present invention have been disclosed. However, the person of ordinary skill will readily recognize modifications to the disclosed embodiments upon reading and understanding the disclosure. All such modifications that basically rely upon the advancements by which the present invention has advanced the state of the art are properly considered within the spirit and scope of the invention.

We claim:

1. A field-effect transistor, comprising:
   a substrate on which are formed a source region, a drain region, and a gate insulating layer;
   a gate electrode over said gate insulating layer, said gate electrode being a first magnetic film; and
   a tunneling magnetoresistance element, including a tunnel junction film disposed over said gate electrode, a second magnetic film formed over a first portion of said first magnetic film with said tunnel junction film therebetween, and a third magnetic film formed over a second portion of said first magnetic film with said tunnel junction therebetween;
   wherein a first tunneling magnetoresistance characteristic is exhibited when an electric current flows between said first magnetic film and said second magnetic film, and a second tunneling magnetoresistance characteristic having a different magnitude than said first tunneling magnetoresistance characteristic is exhibited when an electric current flows between said first magnetic film and said third magnetic film.

2. A field-effect transistor as claimed in claim 1, wherein said tunnel junction film between said first magnetic film and said second magnetic film and between said first magnetic film and said third magnetic film is arranged to be connected to a constant voltage bias circuit.

3. A field-effect transistor as claimed in claim 2, wherein an output signal is generated when an electric current flows through said drain region, and wherein said output current changes with a potential change of said first magnetic film with respect to any of said second magnetic film and said third magnetic film.

4. A field-effect transistor as claimed in claim 3, wherein a gate threshold is selected through a gate potential adjustment by said constant voltage bias circuit, and wherein the response of said output signal to the change in an external magnetic field can be selected.

5. A field-effect transistor element, comprising:

a substrate on which are formed a source region, a drain region, and a gate insulating layer;

a gate electrode over said gate insulating layer, said gate electrode being a first magnetic film; and a tunneling magnetoresistance element, including a tunnel junction film disposed over said gate electrode, a second magnetic film formed over a first portion of said first magnetic film with said tunnel junction film therebetween, and a nonmagnetic film formed over a second portion of said first magnetic film with said tunnel junction therebetween;

wherein a tunneling magnetoresistance characteristic is exhibited when an electric current flows between said first magnetic film and said second magnetic film, but no tunneling magnetoresistance characteristic is exhibited when an electric current flows between said first magnetic film and said nonmagnetic film.

6. A field-effect transistor as claimed in claim 5, wherein said tunnel junction film between said first magnetic film and said second magnetic film and between said first magnetic film and said nonmagnetic film is arranged to be connected to a constant voltage bias circuit.

7. A field-effect transistor as claimed in claim 6, wherein said first magnetic film is one of a hard magnetic film and a soft magnetic film, and said second magnetic film is the other of said hard magnetic film and said soft magnetic film.

8. A field-effect transistor as claimed in claim 7, characterized in that said hard magnetic film is any one selected from a Co-17at%Pt film, a Co—Cr—Ta alloy film and an Ni—Fe/Mn-20at%Ir/Cu/Hf/SiO$_2$/Si (substrate) multilayer film; and in that said soft magnetic film is anyone selected from an Ni-20at%Fe film, an Ni-16at%Fe-18at%Co film and a Co-10at%Fe film.

9. A field-effect transistor as claimed in claim 5, wherein said tunnel junction film between said first magnetic film and said second magnetic film and between said first magnetic film and said nonmagnetic film is arranged to be connected to a constant voltage bias circuit.

10. A field-effect transistor as claimed in claim 9, wherein an output signal is generated when an electric current flows through said drain region, and wherein said output current changes with a potential change of said first magnetic film with respect to any of said second magnetic film and said nonmagnetic film.

11. A field-effect transistor as claimed in claim 10, wherein a gate threshold is selected through a gate potential adjustment by said constant voltage bias circuit, and wherein the response of said output signal to the change in an external magnetic field can be selected.

12. A field-effect transistor as claimed in claim 11, wherein said tunnel junction film between said first magnetic film and said second magnetic film and between said first magnetic film and said nonmagnetic film is arranged to be connected to a constant voltage bias circuit.

13. A field-effect transistor as claimed in claim 10, wherein said tunnel junction film between said first magnetic film and said second magnetic film and between said first magnetic film and said nonmagnetic film is arranged to be connected to a constant voltage bias circuit.

14. A field-effect transistor as claimed in claim 9, wherein said tunnel junction film between said first magnetic film and said second magnetic film and between said first magnetic film and said nonmagnetic film is arranged to be connected to a constant voltage bias circuit.

15. A magnetic sensor, comprising the field-effect transistor claimed in claim 1.

16. A magnetic sensor, comprising the field-effect transistor claimed in claim 5.

17. A magnetic head, comprising the field-effect transistor claimed in claim 1 as a reading head.

18. A magnetic head, comprising the field-effect transistor claimed in claim 5 as a reading head.

19. A magnetic head as claimed in claim 18, wherein said tunneling magnetoresistance element is formed in a silicon layer over an SOI substrate.

20. A magnetic memory cell, comprising the field-effect transistor claimed in claim 1, wherein the magnetized state of the gate electrode is changed by the tunneling magnetoresistance effect, the magnetized state of the gate electrode thus representing the stored value of the magnetic memory cell.

21. A magnetic memory cell, comprising the field-effect transistor claimed in claim 5, wherein the magnetized state of the gate electrode is changed by the tunneling magnetoresistance effect, the magnetized state of the gate electrode thus representing the stored value of the magnetic memory cell.

22. A magnetic memory cell as claimed in claim 21, wherein said magnetized state is changed by a magnetic field which is induced by allowing an electric current to flow through an electric wiring arranged in the vicinity of the gate electrode made of said first magnetic film.

23. A magnetic memory cell as claimed in claim 20, further comprising a word line, a data line, a writing line, and a writing bias line connected to said magnetic memory cell to effect reading/writing with respect to the magnetic memory cell.

* * * * *